(12) United States Patent
Tang et al.

(10) Patent No.: US 11,681,399 B2
(45) Date of Patent: Jun. 20, 2023

(54) USER-INPUT SYSTEMS AND METHODS OF DETECTING A USER INPUT AT A COVER MEMBER OF A USER-INPUT SYSTEM

(71) Applicant: UltraSense Systems, Inc., San Jose, CA (US)

(72) Inventors: Hao-Yen Tang, San Jose, CA (US); Andrew Jonathan Wright, Fremont, CA (US)

(73) Assignee: UltraSense Systems, Inc., San Jose, CA (US)

(*) Notice: Subject to any disclaimer, the term of this patent is extended or adjusted under 35 U.S.C. 154(b) by 0 days.

(21) Appl. No.: 17/854,177

(22) Filed: Jun. 30, 2022

(65) Prior Publication Data
US 2023/0004245 A1 Jan. 5, 2023

Related U.S. Application Data

(60) Provisional application No. 63/216,663, filed on Jun. 30, 2021.

(51) Int. Cl.
*G06F 3/044* (2006.01)
*G06F 3/041* (2006.01)
*G06F 3/01* (2006.01)

(52) U.S. Cl.
CPC .............. *G06F 3/044* (2013.01); *G06F 3/016* (2013.01); *G06F 3/041662* (2019.05); *G06F 2203/04105* (2013.01); *G06F 2203/04106* (2013.01); *G06F 2203/04108* (2013.01)

(58) Field of Classification Search
CPC .. G06F 3/03547; G06F 3/04164; G06F 3/016; G06F 3/044; G06F 3/04886; G06F 3/0412; G06F 2203/04105; H01L 41/0973
See application file for complete search history.

(56) References Cited

U.S. PATENT DOCUMENTS

| 4,412,544 | A | 11/1983 | Beretsky et al. |
| 7,301,212 | B1* | 11/2007 | Mian .................. H04R 19/016 257/419 |
| 8,676,540 | B1 | 3/2014 | Welch et al. |
| 10,466,844 | B1 | 10/2019 | Tang et al. |

(Continued)

FOREIGN PATENT DOCUMENTS

WO WO2018077761 5/2018

*Primary Examiner* — William Lu
(74) *Attorney, Agent, or Firm* — Perkins Coie LLP

(57) ABSTRACT

A user-input system includes a force-measuring device, a cover member, and an elastic circuit board substrate interposed between the force-measuring device and the cover member and mechanically coupled to the cover member and to the force-measuring device. The force-measuring device includes a strain-sensing element. The force-measuring device is mounted to and electrically connected to the elastic circuit board substrate. The cover member undergoes a primary mechanical deformation in response to forces imparted at the cover member. The elastic circuit board substrate transmits a portion of the primary mechanical deformation to the force-measuring device resulting in a concurrent secondary mechanical deformation of the force-measuring device. The strain-sensing element is configured to output voltage signals in accordance with a time-varying strain at the strain-sensing element resulting from the secondary mechanical deformation.

24 Claims, 12 Drawing Sheets

(56) References Cited

U.S. PATENT DOCUMENTS

| | | |
|---|---|---|
| 10,585,534 B2 | 3/2020 | Tang et al. |
| 10,719,175 B2 | 7/2020 | Akhbari et al. |
| 10,775,938 B2 | 9/2020 | Tang et al. |
| 11,481,062 B1* | 10/2022 | Wright ................. G06F 3/0414 |
| 2001/0000666 A1 | 5/2001 | Wood et al. |
| 2002/0005108 A1 | 1/2002 | Ludwig |
| 2003/0144814 A1 | 7/2003 | Hama et al. |
| 2003/0217873 A1 | 11/2003 | Paradiso et al. |
| 2003/0233233 A1 | 12/2003 | Hong |
| 2007/0260425 A1 | 11/2007 | Kim |
| 2008/0316184 A1 | 12/2008 | D'Souza |
| 2009/0157206 A1 | 6/2009 | Weinberg et al. |
| 2009/0224161 A1 | 9/2009 | Fritsch et al. |
| 2010/0053087 A1* | 3/2010 | Dai ...................... G06F 3/0202 |
| | | 178/18.06 |
| 2010/0117993 A1 | 5/2010 | Kent |
| 2010/0139991 A1 | 6/2010 | Phillip et al. |
| 2010/0258361 A1 | 10/2010 | Yamauchi et al. |
| 2011/0061464 A1 | 3/2011 | Yi-min |
| 2011/0133577 A1* | 6/2011 | Lee ....................... H02K 33/18 |
| | | 310/15 |
| 2011/0278078 A1* | 11/2011 | Schediwy ............ G06F 3/0446 |
| | | 702/41 |
| 2012/0274599 A1* | 11/2012 | Schediwy ............ G06F 3/0447 |
| | | 345/174 |
| 2012/0274609 A1 | 11/2012 | Sheng et al. |
| 2013/0167663 A1* | 7/2013 | Eventoff ............ G06F 3/04144 |
| | | 73/862.627 |
| 2013/0345864 A1 | 12/2013 | Park et al. |
| 2014/0022189 A1 | 1/2014 | Sheng et al. |
| 2014/0071095 A1 | 3/2014 | Godsill |
| 2014/0230575 A1* | 8/2014 | Picciotto ................. G06F 3/016 |
| | | 73/862.626 |
| 2015/0077345 A1* | 3/2015 | Hwang ................. G06F 3/0412 |
| | | 345/173 |
| 2015/0148674 A1 | 5/2015 | Park et al. |
| 2015/0169136 A1 | 6/2015 | Ganti et al. |
| 2015/0318462 A1* | 11/2015 | Kim .................... H01L 41/0933 |
| | | 310/332 |
| 2016/0216794 A1 | 7/2016 | Yoon et al. |
| 2016/0246449 A1 | 8/2016 | Jarske |
| 2016/0291761 A1* | 10/2016 | Huie ....................... G06F 3/045 |
| 2017/0062309 A1* | 3/2017 | Ogras ............... H01L 23/49894 |
| 2017/0068318 A1* | 3/2017 | McClure ................. G06F 3/016 |
| 2017/0090599 A1* | 3/2017 | Kuboyama .......... H03K 17/962 |
| 2017/0110504 A1 | 4/2017 | Panchawagh et al. |
| 2017/0153703 A1* | 6/2017 | Yun ......................... G06F 3/016 |
| 2017/0168630 A1* | 6/2017 | Khoshkava ........... G06F 3/0484 |
| 2017/0228096 A1* | 8/2017 | Nathan ............. G06F 3/041661 |
| 2017/0255338 A1 | 9/2017 | Medina |
| 2017/0322290 A1 | 11/2017 | Ng et al. |
| 2017/0336903 A1 | 11/2017 | Rivaud et al. |
| 2017/0336926 A1 | 11/2017 | Chaudhri et al. |
| 2017/0357325 A1* | 12/2017 | Yang ..................... G06F 3/0443 |
| 2018/0032161 A1 | 2/2018 | Shi et al. |
| 2018/0032211 A1 | 2/2018 | King |
| 2018/0039392 A1 | 2/2018 | Kim et al. |
| 2018/0081441 A1* | 3/2018 | Pedder ................ G06F 3/03547 |
| 2018/0113039 A1* | 4/2018 | Drueding .............. G01L 5/1627 |
| 2018/0124521 A1* | 5/2018 | Giusti .................. H04R 31/003 |
| 2018/0164937 A1 | 6/2018 | Lynn |
| 2018/0192520 A1* | 7/2018 | Choong ................. H01L 21/56 |
| 2018/0246612 A1 | 8/2018 | Lynn et al. |
| 2018/0276439 A1 | 9/2018 | Strohmann et al. |
| 2018/0276440 A1 | 9/2018 | Strohmann et al. |
| 2018/0284892 A1 | 10/2018 | Kwon et al. |
| 2018/0323783 A1 | 11/2018 | Bang et al. |
| 2019/0004661 A1* | 1/2019 | Lee ..................... G01R 31/2891 |
| 2019/0050618 A1 | 2/2019 | Khuri-Yakub |
| 2019/0073079 A1* | 3/2019 | Xu ......................... G06F 3/0443 |
| 2019/0074833 A1 | 3/2019 | Sheng |
| 2019/0310723 A1* | 10/2019 | Kang ..................... H04W 4/00 |
| 2019/0354209 A1 | 11/2019 | Tang et al. |
| 2019/0354236 A1 | 11/2019 | Akhbari et al. |
| 2019/0354237 A1 | 11/2019 | Tang et al. |
| 2019/0354238 A1 | 11/2019 | Akhbari et al. |
| 2020/0087823 A1* | 3/2020 | Coxeter ................. D03D 1/0088 |
| 2021/0181041 A1 | 6/2021 | Tang |
| 2021/0240267 A1* | 8/2021 | Gajiwala ............. G06F 3/04847 |
| 2021/0242393 A1 | 8/2021 | Tang |
| 2021/0278926 A1 | 9/2021 | Akhbari et al. |
| 2021/0293641 A1 | 9/2021 | Tu et al. |
| 2021/0293648 A1 | 9/2021 | Tu et al. |

* cited by examiner

USER-INPUT SYSTEMS AND METHODS OF DETECTING A USER INPUT AT A COVER MEMBER OF A USER-INPUT SYSTEM

CROSS-REFERENCE TO RELATED APPLICATION(S)

This application claims the benefit of U.S. Provisional Patent Application No. 63/216,663 filed on Jun. 30, 2021, entitled USER-INPUT SYSTEMS AND METHODS OF DETECTING A USER INPUT AT A COVER MEMBER OF A USER-INPUT SYSTEM, which is incorporated herein by reference in its entirety.

BACKGROUND

Capacitance sensing is a widely used method of detecting user input. A capacitance-sensing system can be configured to measure a self-capacitance between a sensor electrode and its surrounding environment or a mutual capacitance between a first sensor electrode and a second sensor electrode. In the self-capacitance case, the surrounding environment can include an object (e.g., a finger) in proximity to or contacting the cover member. In the self-capacitance case, the presence of a water droplet in proximity to or contacting the cover member does not significantly change the capacitance, compared to only air being present. In the mutual capacitance case, the object in proximity to or contacting the cover member near the first sensor electrode and the second sensor electrode alters the mutual capacitance. In the mutual capacitance case, the object that causes the mutual capacitance to change can be a finger or a water droplet, for example. To measure the self-capacitance or the mutual capacitance, it is important that the cover member be electrically non-conducting.

Capacitance sensing is useful for detecting user input. However, there is a need to improve rejection of false signals and to provide more refined information such as force of touch. Accordingly, improved user-input systems and methods of detecting user input are desired.

SUMMARY OF THE INVENTION

In one aspect, a user-input system includes a force-measuring device, a cover member, and an elastic circuit board substrate interposed between the force-measuring device and the cover member and mechanically coupled to the cover member and to the force-measuring device. The force-measuring device includes a strain-sensing element. The force-measuring device is mounted to and electrically connected to the elastic circuit board substrate. The cover member undergoes a primary mechanical deformation in response to forces imparted at the cover member. The elastic circuit board substrate transmits a portion of the primary mechanical deformation to the force-measuring device resulting in a concurrent secondary mechanical deformation of the force-measuring device. The strain-sensing element is configured to output voltage signals in accordance with a time-varying strain at the strain-sensing element resulting from the secondary mechanical deformation.

In another aspect, a user-input system includes a force-measuring device, an electrically non-conducting cover member, and an elastic circuit board substrate interposed between the force-measuring device and the cover member and mechanically coupled to the cover member and to the force-measuring device. The force-measuring device includes a piezoelectric micromechanical force-measuring element (PMFE). The force-measuring device is mounted to and electrically connected to the elastic circuit board substrate. The user-input system additionally includes sensor electrodes positioned on or in the elastic circuit board substrate and a signal processor electronically coupled to the PMFE and the sensor electrodes. The cover member undergoes a primary mechanical deformation in response to forces imparted at the cover member. The elastic circuit board substrate transmits a portion of the primary mechanical deformation to the force-measuring device resulting in a concurrent secondary mechanical deformation of the force-measuring device. The PMFE is configured to output voltage signals (PMFE voltage signals) in accordance with a time-varying strain at the PMFE resulting from the secondary mechanical deformation. The signal processor is configured to read at least some of the PMFE voltage signals. The signal processor is configured to, for each of the sensor electrodes, (1) measure a capacitance between the respective sensor electrode and its surrounding environment (self-capacitance data) and/or (2) measure a capacitance between the respective sensor electrode and an adjacent one of the sensor electrodes (mutual capacitance data). The signal processor is configured to detect a user input at the cover member in accordance with the PMFE voltage signals and at least one of the self-capacitance data and the mutual capacitance data.

In yet another aspect, a method of detecting a user input at a cover member of a user-input system includes the following steps. Step (A1) includes configuring a force-measuring device. The force-measuring device includes a strain-sensing element. The force-measuring device is mounted to and electrically connected to an elastic circuit board substrate. Step (A2) includes configuring the cover member and the elastic circuit board substrate interposed between the force-measuring device and the cover member. The elastic circuit board substrate is mechanically coupled to the cover member and to the force-measuring device. Step (A3) includes transmitting, by the elastic circuit board substrate, a portion of a primary mechanical deformation of the cover member to the force-measuring device such that the force-measuring device undergoes a secondary mechanical deformation. Step (A4) includes outputting, by the strain-sensing element, voltage signals in accordance with a time-varying strain at the strain-sensing element resulting from the secondary mechanical deformation.

In yet another aspect, a method of detecting a user input at a cover member of a user-input system includes the following steps. Step (B1) includes configuring a force-measuring device. The force-measuring device includes a piezoelectric micromechanical force-measuring element (PMFE). The force-measuring device is mounted to and electrically connected to an elastic circuit board substrate. The PMFE is electronically coupled to a signal processor. Step (B2) includes configuring sensor electrodes on or in the elastic circuit board substrate. The sensor electrodes are electronically coupled to the signal processor. Step (B3) includes configuring the cover member and the elastic circuit board substrate interposed between the force-measuring device and the cover member. The elastic circuit board substrate is mechanically coupled to the cover member and to the force-measuring device. Step (B4) includes transmitting, by the elastic circuit board substrate, a portion of a primary mechanical deformation of the cover member to the force-measuring device such that the force-measuring device undergoes a secondary mechanical deformation. Step (B5) includes outputting, by the PMFE, voltage signals (PMFE voltage signals) in accordance with a time-varying strain at the PMFE resulting from the secondary mechanical deformation. Step (B6) includes measuring, by the signal processor, for each of the sensor electrodes, (1) a capacitance between the respective sensor electrode and its surrounding environment (self-capacitance data) and/or (2) a capacitance between the respective sensor electrode and an adjacent one of the sensor electrodes (mutual capacitance data). Step (B7) includes reading, by the signal processor, at least some of the PMFE voltage signals. Step (B8) includes detecting, by the signal processor, a user input at the cover member in accordance with the PMFE voltage signals and at least one of the self-capacitance data and the mutual capacitance data.

The above summary of the present invention is not intended to describe each disclosed embodiment or every implementation of the present invention. The description that follows more particularly exemplifies illustrative embodiments. In several places throughout the application, guidance is provided through examples, which examples can be used in various combinations. In each instance of a list, the recited list serves only as a representative group and should not be interpreted as an exclusive list.

BRIEF DESCRIPTION OF THE FIGURES

The disclosure may be more completely understood in consideration of the following detailed description of various embodiments of the disclosure in connection with the accompanying drawings, in which.

DETAILED DESCRIPTION OF ILLUSTRATIVE EMBODIMENTS

The present disclosure relates to user-input systems, user-input modules, and methods of detecting a user-input at a cover member of a user-input system.

In this disclosure:

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the invention.

The terms "comprises" and variations thereof do not have a limiting meaning where these terms appear in the description and claims.

Unless otherwise specified, "a," "an," "the," and "at least one" are used interchangeably and mean one or more than one.

The recitations of numerical ranges by endpoints include all numbers subsumed within that range (e.g., 1 to 5 includes 1, 1.5, 2, 2.75, 3, 3.80, 4, 5, etc.).

For any method disclosed herein that includes discrete steps, the steps may be conducted in any feasible order. As appropriate, any combination of two or more steps may be conducted simultaneously.

Figure 1:
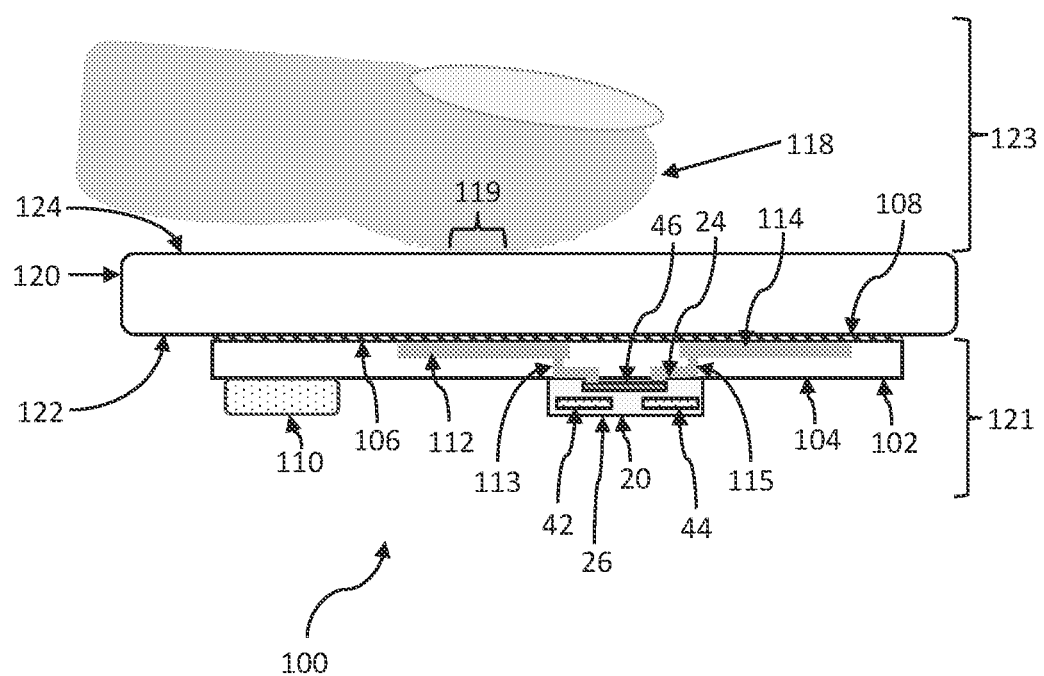
FIG. 1 is a schematic view of an illustrative user-input system.

FIG. 1 is a schematic view of a user-input system 100. The user-input system 100 includes a force-measuring device 20 implemented as packaged integrated circuits (IC). In the example shown, the force-measuring device 20 includes strain-sensing elements 42, 44. Each strain-sensing element 42, 44 is configured to output voltage signals in accordance with a time-varying strain at each respective strain-sensing element. For example, the strain-sensing element can be a piezoelectric micromechanical force-measuring element (PMFE) or a piezoresistive element. The user-input system 100 also includes a cover member 120 and an elastic circuit board substrate 102 interposed between the force-measuring device 20 and the cover member 120. The elastic circuit board substrate 102 is mechanically coupled to the cover member 120 and to the force-measuring device 20. The force-measuring device 20 is mounted to and electrically connected to the elastic circuit board substrate 102. In the example shown, the force-measuring device 20 is mounted to and electrically connected to the elastic circuit board substrate 102 at its first surface (bottom surface) 104. For example, there are sensor electrodes 112, 114 on or in in the elastic circuit board substrate 102. An electrical wiring 113 electrically connects sensor electrode 112 to a circuit (signal processor 46) in the force-measuring device 20. An electrical wiring 115 electrically connects sensor electrode 114 to the signal processor 46. The force-measuring device 20 can be attached to the elastic circuit board substrate by solder-bonding, for example. Additionally, other integrated circuits (IC), electrical components, and electromechanical components (e.g., a motor) can be mounted the elastic circuit board substrate 102 at the bottom surface 104. These other components are collectively labeled as 110 in FIG. 1.

The cover member 120 has an exposed outer surface 124 and an inner surface 122 opposite the outer surface. The cover member 120 should be robust but should be sufficiently deformable such that a deformation of the cover member is transmitted to the strain-sensing elements in the force-measuring device. FIG. 1 shows an example of a contact point 119, which is an area where the finger 118 contacts the outer surface 124 of the cover member 120 when touching, tapping, and/or pressing. The cover member 120 can be a robust material that deforms when pressed by the finger 118. Examples of such robust materials are wood, glass, metal, plastic, leather, fabric, and ceramic. However, for user-input systems that are configured to measure self-capacitance or mutual capacitance, the cover member should be electrically non-conducting. In this case, the use of metal can be avoided. The cover member 120 could also be a composite stack of any of the foregoing materials. The elastic circuit board substrate 102 is adhered to or attached to the inner surface 122 of the cover member 120 by a layer of adhesive 108, for example. The choice of adhesive 108 is not particularly limited if the elastic circuit board substrate 102 remains attached to the cover member. The adhesive 108 could be double-sided tape, pressure sensitive adhesive (PSA), epoxy adhesive, or acrylic adhesive, for example. The adhesive 108 is applied between the inner surface 122 of the cover member 120 and the second surface (top surface) 106 of the elastic circuit board substrate 102 opposite the bottom surface 104. The cover member 120 undergoes a primary mechanical deformation in response to forces imparted at the cover member. For example, forces are imparted at the cover member if the finger 118 touches and/or presses the cover member 120 at a contact point 119 (in such a case, contact point 119 also becomes a force-imparting point). The elastic circuit board substrate 102 transmits a portion of the primary mechanical deformation to the force-measuring device 20 resulting in a concurrent secondary mechanical deformation of the force-measuring device 20. Each strain-sensing element 42, 44 is configured to output voltage signals in accordance with a time-varying strain at the respective strain-sensing element resulting from the secondary mechanical deformation.

Figure 2:
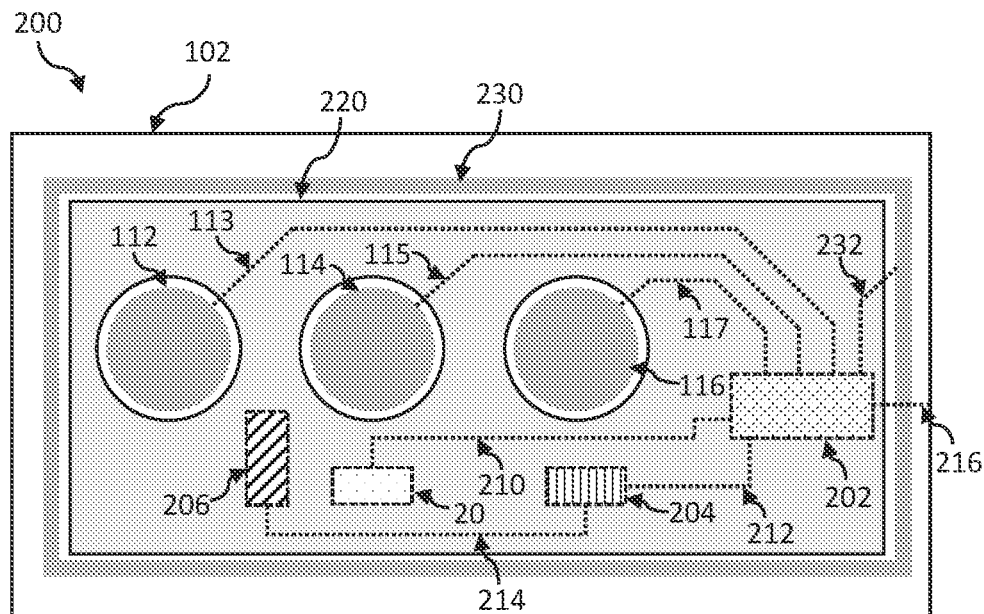
FIGS. 2 and 3 are schematic plan views of circuit board substrates according to preferred embodiments.
Figure 10:
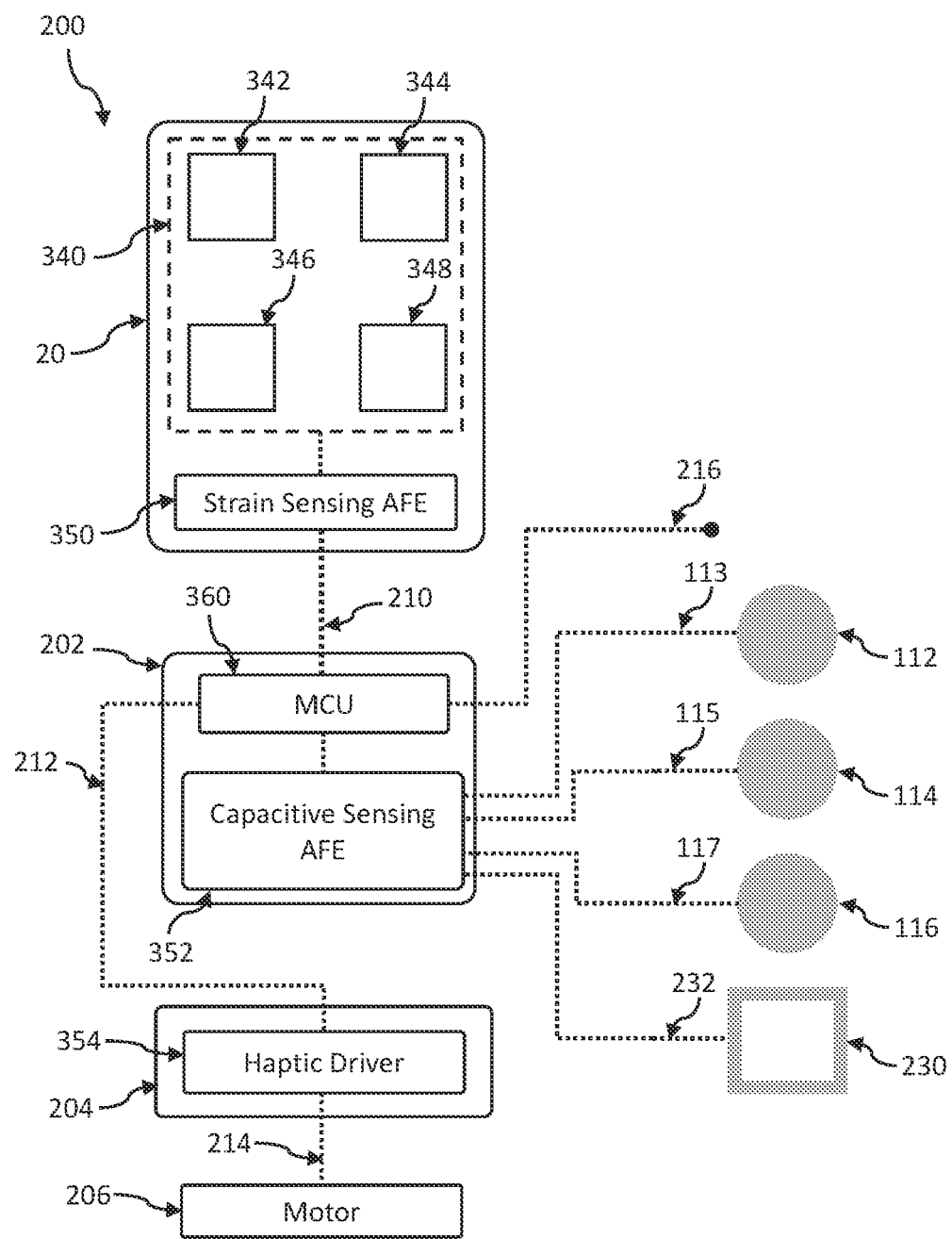
FIGS. 10 and 11 are schematic block diagrams of user-input systems.

FIG. 2 is a plan view of an elastic circuit board substrate 102 in a user-input system 200. FIG. 10 corresponds to FIG. 2 and is a schematic block diagram of user-input system 200. Sensor electrodes 112, 114, 116 are positioned on or in the elastic circuit board substrate 102. The sensor electrodes 112, 114, 116 are connected, via respective electrical wiring 113, 115, 117, to a system-on-a-chip (SoC) 202. SoC 202 includes a capacitive-sensing analog front-end (AFE) circuit 352 and a microcontroller (MCU) 360. The electrical wiring 113, 115, and 117 electrically connect the respective sensor electrodes 112, 114, 116 to the capacitive-sensing AFE 352. There is also a proximity sensor electrode 230 positioned on or in the elastic circuit board substrate 102. The proximity sensor electrode 230 is connected, via electrical wiring 232, to the capacitive-sensing AFE 352 of the SoC 202. In the example shown, the proximity sensor electrode 230 encloses the sensor electrodes (112, 114, 116). For example, the proximity sensor electrode encloses an area that is greater than an area of one of the sensor electrodes by a factor of at least 2. Preferably, there is a grounded electrode 220 which separates the sensor electrodes (112, 114, 116) and the proximity sensor electrode (230) from each other. The sensor electrodes (112, 114, 116), the proximity sensor electrode (230), and the grounded electrode (220) can be included in one layer of metal in the circuit board substrate 102. The illustrated wiring 113, 115, 117, 210, 212, 214, 232 can be included in a wiring layer, different from the electrode layer.

In the example shown, the user-input system 200 additionally includes a force-measuring device 20, a haptic driver IC 204, and a haptic motor 206, mounted to the bottom surface 104 of the elastic circuit board substrate 102. The haptic driver IC 204 and haptic motor 206 correspond to other components 110 in FIG. 1. The haptic driver IC 204 includes a haptic driver circuit 354. There is an electrical wiring 214 between the haptic driver 354 and the haptic motor 206. The haptic motor 206 is driven by the haptic driver 354. Since the haptic motor 206 is mounted to the elastic circuit board substrate 102 and the elastic circuit board substrate 102 is mechanically coupled to the cover member 120, the haptic motor 206 is mechanically coupled to the cover member 120.

The force-measuring device 20 includes a micro-electromechanical systems (MEMS) portion 340 and a strain-sensing AFE 350 (FIG. 10). The strain-sensing AFE 350 is included in the application-specific integrated circuit (ASIC) portion of the force-measuring device 20. In the example shown, the MEMS portion 340 includes 4 piezoelectric micromechanical force-measuring elements (PMFEs) 342, 344, 346, 348. In the example shown, the strain-sensing AFE 350 is configured to read at least some of the PMFE voltage signals. Strain-sensing AFE 350 includes analog signal processing circuitry (including amplifiers) for conditioning the voltage signals from the PMFEs. There is an electrical wiring 210 between the strain-sensing AFE 350 and the MCU 360. There is an electrical wiring 212 between the MCU 360 and the haptic driver 354. The strain-sensing AFE 350, the MCU 360, the capacitive-sensing AFE 352, and the haptic driver 354 can be referred to collectively as a signal processor. There can be electrical wiring 216 (e.g., bus wiring) between the MCU 360 and another component. For example, the other component can be a microprocessor located off the elastic circuit board substrate 102.

Capacitive-sensing AFE 352 includes analog signal processing circuitry (including amplifiers) for conditioning the analog signal from the sensor electrodes (112, 114, 116) and/or the proximity sensor electrode(s) 230. After signal conditioning, capacitance signals from the sensor electrodes and/or the proximity sensor electrode(s) can be processed by the MCU 360. For each of the sensor electrodes, the signal processor is configured to: (1) measure a capacitance between the respective sensor electrode and its surrounding environment (self-capacitance data) and/or (2) measure a capacitance between the respective sensor electrode and an adjacent one of the sensor electrodes (mutual capacitance data). Similarly, for each proximity sensor electrode, the signal processor is configured to measure a capacitance between the proximity sensor electrode and its surrounding environment (proximity self-capacitance data).

Preferably, the capacitive-sensing AFE 352 and the proximity sensor electrode 230 are configured to have greater sensitivity to capacitance changes at the proximity sensor electrode 230 than at the sensor electrodes 112, 114, and 116. Accordingly, the proximity sensor electrodes can be used to measure capacitance changes at the proximity sensor electrode 230 caused by an object (e.g., a finger) approaching but not yet touching the cover member 120. On the other hand, the sensor electrodes can be used to measure capacitance changes at the sensor electrodes 112, 114, 116 caused by an object (e.g., a finger) touching the cover member 120. Preferably, the signal processor is configured to detect proximity of an object to the cover member 120 when at least the following condition is satisfied: a magnitude of the proximity self-capacitance data exceeds a proximity self-capacitance threshold. For example, the proximity self-capacitance threshold can be predetermined (e.g., determined at the time of programming the signal processor) or algorithmically determined (e.g., determined and changed from time to time by an algorithm). Additionally, the signal processor can be configured to measure the self-capacitance data and/or the mutual capacitance data when the signal processor detects proximity of the object.

Figure 3:
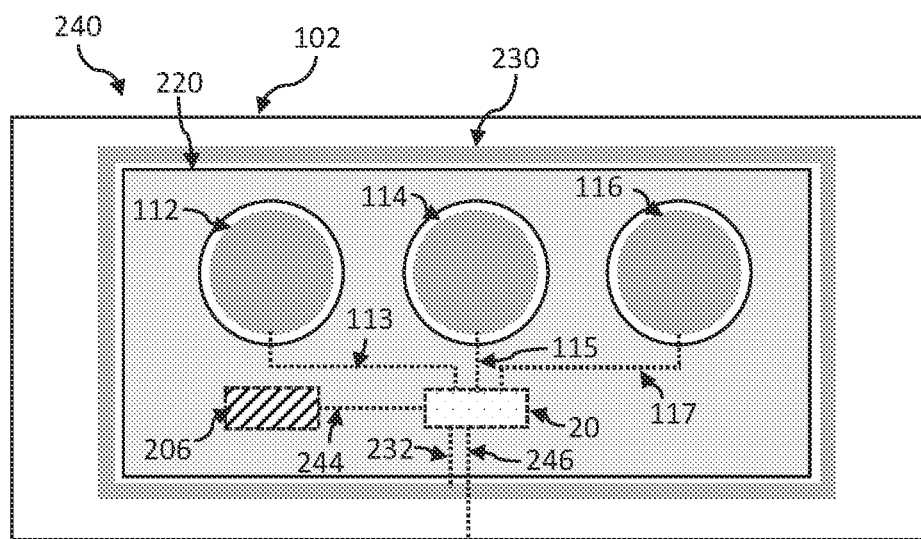
Figure 11:
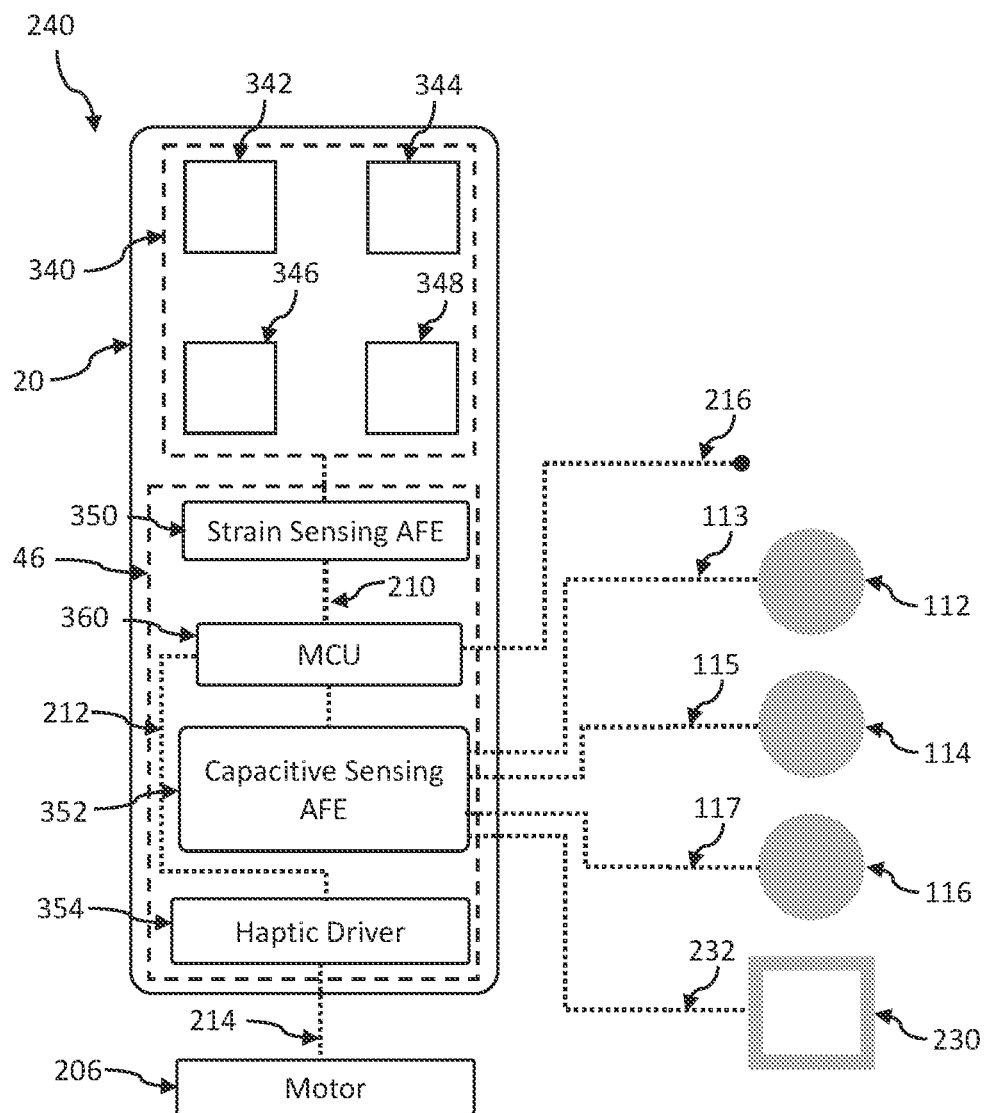

FIG. 3 is a plan view of an elastic circuit board substrate 102 in a user-input system 240. FIG. 11 corresponds to FIG. 3 and is a schematic block diagram of user-input system 240. This system implementation 240 differs from the system implementation 200 in that the signal processor circuits are integrated into the force-measuring device 20. In the example shown, the MCU 360, the capacitive-sensing AFE 352, and haptic driver 354 are included in the force-measuring device. The signal processor 46, including the strain-sensing AFE 350, the MCU 360, the capacitive-sensing AFE 352, and haptic driver 354 are included in the force-measuring device 20. Embodiments are possible in which a portion of the signal processor 46 is included in the force-measuring device 20 or an entirety of the signal processor 46 is included in the force-measuring device. It is possible for a portion or an entirety of the haptic driver 354 to be included in the force-measuring device 20.

Figure 4:
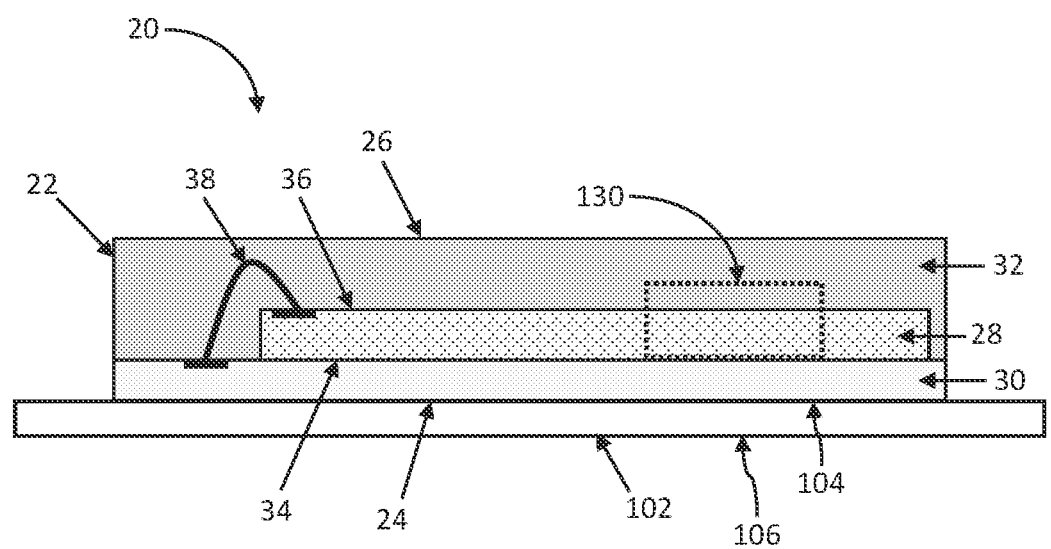
FIG. 4 is a schematic cross-sectional view of a force-measuring device.

The force-measuring device is shown in greater detail in FIG. 4. FIG. 4 is a cross-sectional view of a force-measuring device 20, with its vertical orientation reversed from that shown in FIG. 1. Force-measuring device 20 is shown encased in a package 22, with an electrical interconnection surface 24 and a second surface 26 opposite the electrical interconnection surface 24. The force-measuring device 20 includes a package substrate 30, semiconductor die (semiconductor chip) 28 mounted to the package substrate 30, and an encapsulating adhesive 32, such as an epoxy adhesive. After the semiconductor die 28 is mounted to the package substrate 30, wire bond connections 38 are formed between the die 28 and the package substrate 30. Then the entire assembly including the die 28 and the package substrate 30 are molded (encapsulated) in an epoxy adhesive 32. In the example shown in FIG. 1, the electrical interconnection surface of the force-measuring device 20 is mounted to and electrically connected to the bottom surface 104 of the elastic circuit board substrate 102. It is preferable that the force-measuring device have lateral dimensions no greater than 10 mm by 10 mm. In the example shown, the wire bond connection 38 is formed between the top surface 36 of the semiconductor die 28 and the package substrate 30. Alternatively, electrical interconnections can be formed between the bottom surface 34 of the semiconductor die 28 and the package substrate. The semiconductor die 28 consists of an application-specific integrated circuit (ASIC) portion and a micro-electromechanical systems (MEMS) portion. A selected portion 130 of the semiconductor die 28 is shown in cross-section in FIG. 5.

Figure 5:
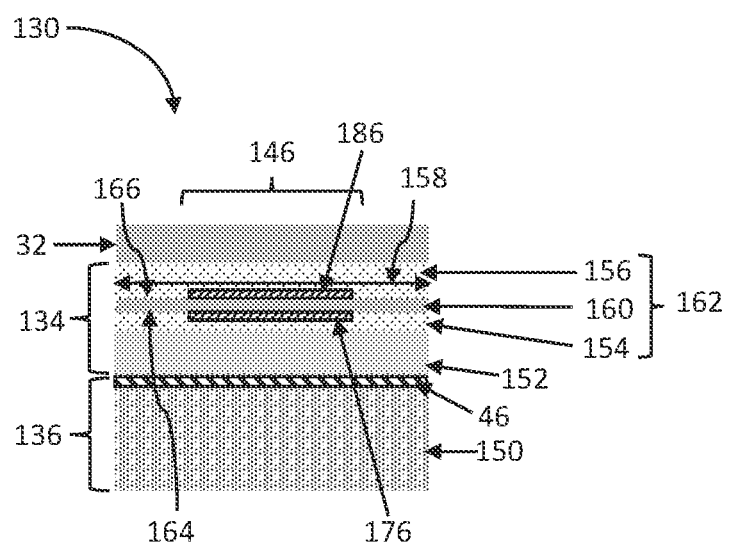
FIG. 5 is a schematic cross-sectional view of a piezoelectric micromechanical force-measuring element (PMFE) of the force-measuring device of FIG. 4.

FIG. 5 is a schematic cross-sectional view of a portion 130 of the force-measuring device 20 of FIG. 4. The semiconductor die 28 includes a MEMS portion 134 and an ASIC portion 136 underneath the PMFE 146. Also shown is an encapsulating adhesive 32 that is above the PMFE 146. Comparing the ASIC portion 136 and the MEMS portion 134, the MEMS portion 134 is closer to the second surface 26 and the ASIC portion 136 is closer to the electrical interconnection surface 24. The ASIC portion 136 consists of a semiconductor substrate 150 and a signal processor 46 thereon or therein. Typically, the semiconductor substrate is a silicon substrate, but other semiconductor substrates such as silicon-on-insulator (SOI) substrates can also be used.

The MEMS portion 134 includes a PMFE 146. The MEMS portion 134 includes a thin-film piezoelectric stack 162 overlying the semiconductor substrate 150. The thin-film piezoelectric stack 162 includes a piezoelectric layer 160, which is a layer exhibiting the piezoelectric effect. Suitable materials for the piezoelectric layer 160 are aluminum nitride, scandium-doped aluminum nitride, polyvinylidene fluoride (PVDF), lead zirconate titanate (PZT), $K_xNa_{1-x}NbO_3$ (KNN), quartz, zinc oxide, lithium niobate, and $Bi_{0.5}Na_{0.5}TiO_3$ (BNT), for example. For example, the piezoelectric layer is a layer of aluminum nitride having a thickness of approximately 1 μm. The piezoelectric layer 160 has a top major surface 166 and a bottom major surface 164 opposite the top major surface 166. In the example shown, the thin-film piezoelectric stack 162 additionally includes a top mechanical layer 156, attached to or adjacent to (coupled to) top major surface 166, and a bottom mechanical layer 154, attached to or adjacent to (coupled to) bottom major surface 164. In the example shown, the thickness of the top mechanical layer 156 is greater than the thickness of the bottom mechanical layer 154. In other examples, the thickness of the top mechanical layer 156 can be smaller than the thickness of the bottom mechanical layer 154. Suitable materials for the mechanical layer(s) are silicon, silicon oxide, silicon nitride, and aluminum nitride, for example. Suitable materials for the mechanical layer(s) can also be a material that is included in the piezoelectric layer 160, which in this case is aluminum nitride. In the example shown, the top mechanical layer and the bottom mechanical layer contain the same material. In other examples, the top mechanical layer and the bottom mechanical layer are of different materials. In other examples, the top mechanical layer or the bottom mechanical layer can be omitted. The mechanical layer(s) adjust the mechanical properties of the thin-film piezoelectric stack 162. When coupled to the cover member, the force-measuring device 20 is preferably oriented such that the piezoelectric layer 160 faces toward the cover member 120. For example, the force-measuring device 20 is oriented such that the piezoelectric layer 160 and the cover member 120 are approximately parallel.

For ease of discussion, only one PMFEs is shown in FIG. 5. However, a typical force-measuring device may contain multiple PMFEs. The PMFEs are located at respective lateral positions along the thin-film piezoelectric stack 162. An insulating support layer 152 supports the thin-film piezoelectric stack. Suitable materials for the support layer 152 are silicon, silicon nitride, and silicon oxide, for example. Suitable materials for the support layer 152 can also be a material that is included in the piezoelectric layer 160, which in this case is aluminum nitride.

Each PMFE 146 includes a respective portion of the thin-film piezoelectric stack 162. Each PMFE 146 includes a first PMFE electrode 176 positioned on a first side (bottom surface) 164 of the piezoelectric layer 160 and a second PMFE electrode 186 positioned on a second side (top surface) 166 opposite the first side. The first PMFE electrode 176 and the second PMFE electrode 186 are positioned on opposite sides of the piezoelectric layer 160. In each PMFE 146, the first PMFE electrode 176, the second PMFE electrode 186, and the portion of the piezoelectric layer 160 between them constitute a piezoelectric capacitor. The piezoelectric layer 160 has a built-in polarization (piezoelectric polarization). The PMFEs are coupled to the signal processor 46.

Figure 6:
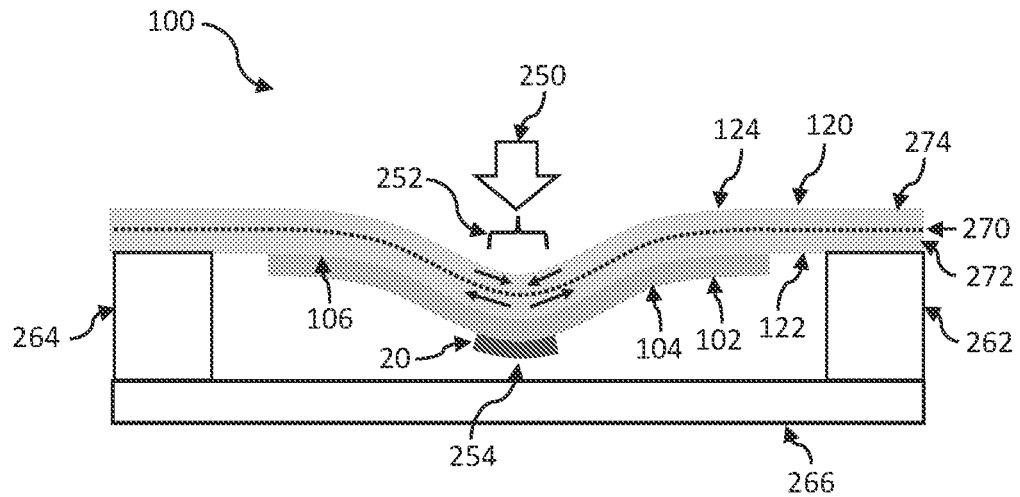
FIGS. 6 and 7 are schematic side views of a force-measuring device, an elastic circuit board substrate, and a cover member undergoing deformation.
Figure 7:
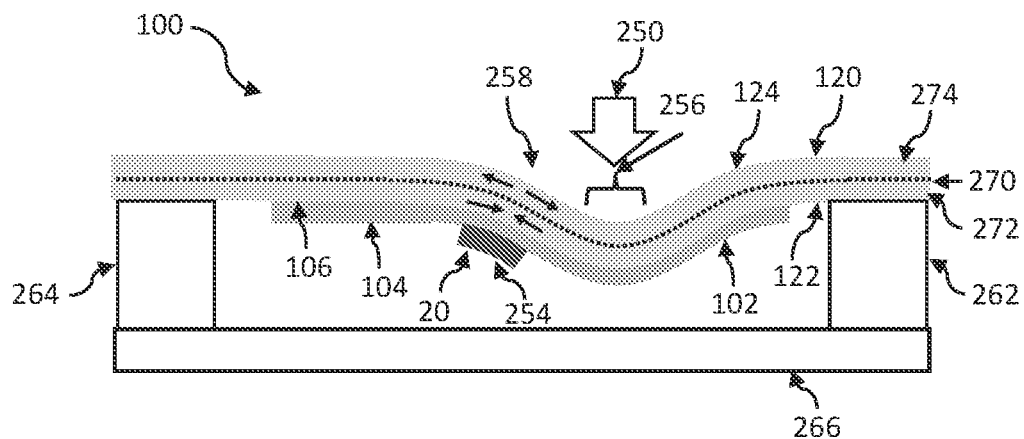

FIG. 5 shows the PMFE in a quiescent state, in which there is no flexing of the piezoelectric stack 162. In the quiescent state, there is no voltage generated between the PMFE electrodes (176, 186). FIGS. 6 and 7 show the use-input system 100 undergoing mechanical deformation. In the example shown, two anchor posts 262, 264 fix the two ends of the cover member 120 to a stiff substrate 266.

The force-measuring device 20 can move with the cover member 120 when the cover member 120 is deflected upwards or downwards. A downward force 250, shown as a downward arrow, is applied by a finger (or another object) pressing against the outer surface 124 of the cover member 120 at a force-imparting point 252 (FIG. 6) or 256 (FIG. 7). A finger pressing against or tapping the outer surface 124 are examples of touch excitation. In the examples shown in FIGS. 6 and 7, the cover member 120 is deflected in a first direction (e.g., downwards) in response to a touch excitation at the respective force-imparting points 252, 256. The cover member 120 undergoes a primary mechanical deformation in response to forces imparted at the cover member. The elastic circuit board substrate 102 transmits a portion of the primary mechanical deformation to the force-measuring device 20 resulting in a concurrent secondary mechanical deformation of the force-measuring device.

A neutral axis 270 is located within the cover member (cover layer) 120. The force-measuring device 20 is located at position 254. In the situation shown in FIG. 6, the force-imparting point 252 approximately overlaps the force-measuring device position 254. A lower portion 272 of the cover member 120, below the neutral axis 270, is under tensile (positive) strain at the force-imparting point 252, represented by outward pointing arrows, primarily along the major surfaces 122, 124 of the cover member 120. The piezoelectric layer 160 has a built-in polarization (piezoelectric polarization). An upper portion 274 of the cover member 120, above the neutral axis 270, is under compressive (negative) strain at the force-imparting point 252, represented by inward pointing arrows, primarily along the major surfaces 122, 124 of the cover member 120. The force-measuring device 20 is coupled, via the elastic circuit board substrate 102, to the lower portion 272 at the force-imparting point 252. The PMFEs 146 are also under tensile (positive) strain. Typically, the entire force-measuring device 20 may be deflected under the applied downward force 250. In the example shown in FIG. 6, the PMFEs 146 are under a positive strain, and the respective portions of the piezoelectric layer 160 at the PMFEs 146 undergo expansion along a lateral direction. As a result, an electrical charge is generated at each PMFE (146) between the respective PMFE electrodes (176, 186). This electrical charge is detectable as a first deflection voltage $V_{d1}$ (corresponding to strain of a certain polarity and magnitude). The polarity of the first deflection voltage $V_{d1}$ at a PMFE depends upon the polarity of the strain (positive strain (tensile) or negative strain (compressive)) at the respective portion of the piezoelectric layer between the respective PMFE electrodes of the PMFE. The magnitude of the first deflection voltage $V_{d1}$ at a PMFE depends upon the magnitude of the strain at the respective portion of the piezoelectric layer between the respective PMFE electrodes of the PMFE. Subsequently, when the downward force 250 is no longer applied to the force-imparting point 252, the cover member 120 deflects in a second direction opposite the first direction (e.g., upwards). This is detectable as a second deflection voltage $V_{d2}$ (corresponding to strain of a certain polarity and magnitude). The polarity of the second deflection voltage $V_{d2}$ at a PMFE depends upon the polarity of the strain at the respective portion of the piezoelectric layer between the respective PMFE electrodes of the PMFE. The magnitude of the second deflection voltage $V_{d2}$ at a PMFE depends upon the magnitude of the strain at the respective portion of the piezoelectric layer between the respective PMFE electrodes of the PMFE.

FIG. 7 shows a downward force 250 being applied at a force-imparting point 256, which is laterally displaced from the force-measuring device position 254. In the example shown, the lower portion 272 of the cover member 120 is under compressive (negative) strain at a region 258 which overlaps the force-measuring device position 254, represented by inward pointing arrows, primarily along the major surfaces 122, 124 of the cover member 120. The upper portion 274 of the cover member 120 is under tensile (positive) strain at the region 258, represented by outward pointing arrows, primarily along the major surfaces 122, 124 of the cover member 120. The force-measuring device 20 is coupled, via the elastic circuit board substrate 102, to the lower portion 272 at the region 258. The PMFEs 146 are also under compressive (negative) strain. These examples illustrate that when the cover member, the elastic circuit board substrate, and the force-measuring device(s) undergo deflection in response to a touch excitation at the outer surface, expansion and/or compression of the piezoelectric layer may be induced.

Figure 8:
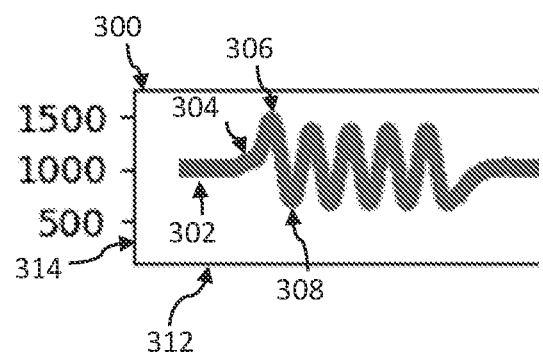
FIGS. 8 and 9 are graphical plots of PMFE data obtained from a force-measuring device in response to forces imparted at respective force-imparting points.
Figure 9:
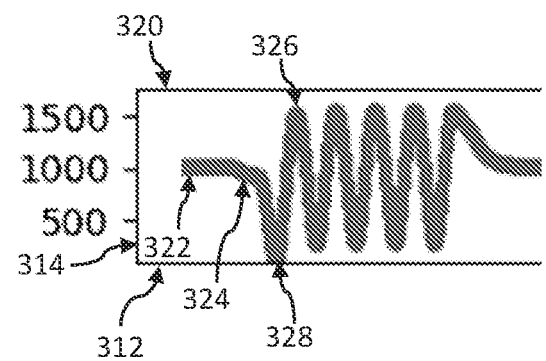

FIGS. 8 and 9 show some examples of force data (PMFE data). FIG. 8 is graphical plot 300 of PMFE data obtained from a force-measuring device in response to a time-varying applied force imparted at a force-imparting point. For example, this PMFE data corresponds to PMFE voltage signals, after amplification and analog-to-voltage conversion at the signal processor 46. The time-varying applied force consists of repetitively pressing at the force-imparting point five times. Plot 300 has a horizontal axis 312 which shows time t and a vertical axis 314 which shows force data (PMFE data), expressed in LSB. For example, a time duration of plot 300 is 10 seconds. Before the application of the time-varying applied force, the PMFEs are in a quiescent state (plot section 302). For example, the PMFE might be in a quiescent state if there is no deformation of the cover member. As the time-varying applied force begins, the PMFE data show a positive slope (plot section 304) and then reaches a maximum 306, corresponding to strain of a first polarity at the PMFEs. This corresponds to the PMFEs under tension (see FIG. 6). As the pressure at the force-imparting point is released, the PMFE data decreases from a maximum 306 to a minimum 308. Local maxima are reached five times, corresponding to repetitively pressing against the force-imparting point five times. A characteristic amplitude of the PMFE data can be defined to be a difference between a local maximum 306 and a local minimum 308. Alternatively, a characteristic amplitude of the PMFE data can be defined to be a difference between a global maximum and a global minimum, within a predetermined time window such as shown in FIG. 8. The characteristic amplitude of the PMFE data can also be referred to as a magnitude of the PMFE voltage signals.

FIG. 9 is graphical plot 320 of PMFE obtained from a force-measuring device in response to a time-varying applied force imparted at a force-imparting point. For example, this force-imparting point is different from the force-imparting point of FIG. 8. This force-imparting point can be laterally displaced from and remote from the force-measuring device. For example, a time duration of plot 320 is 10 seconds. Before the application of the time-varying applied force, the PMFEs are in a quiescent state (plot section 322). As the time-varying applied force begins, the PMFE data show a negative slope (plot section 324) and then reaches a local minimum 328, corresponding to strain of a second polarity at the PMFEs. This corresponds to the PMFEs under compression (see FIG. 7). As the pressure at the force-imparting point is released, the PMFE data increases from a local minimum 328 to a local maximum 326. Local minima are reached five times, corresponding repetitively pressing against the force-imparting point five times. A characteristic amplitude of the PMFE data can be defined to be a difference between the local maximum 326 and the local minimum 328. Alternatively, a characteristic amplitude of the PMFE can be defined to be a difference between a global maximum and a global minimum, within a predetermined time window such as shown in FIG. 9.

Figure 12:
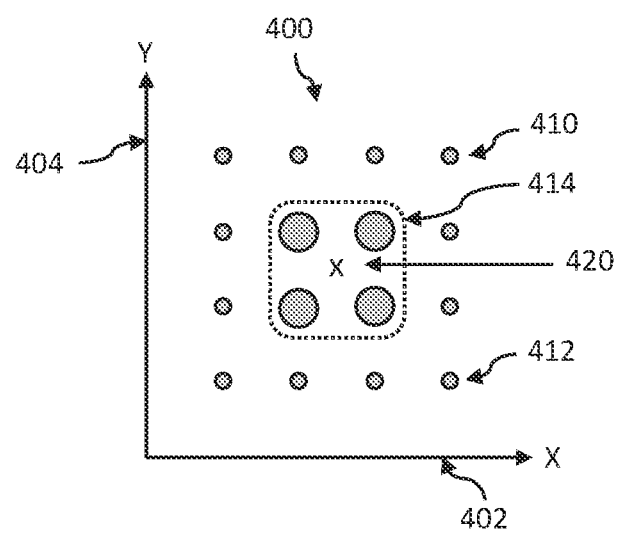
FIG. 12 is a map of capacitance data for a two-dimensional array of sensor electrodes.

FIG. 12 is a map 400 of capacitance data for a two-dimensional array of sensor electrodes. The sensor electrodes (grey circles 410) are arranged in a two-dimensional array extending along the X-axis 402 and Y-axis 404. The map 400 can be a map of self-capacitance data of each of sensor electrodes or a map of mutual capacitance data between each of the sensor electrodes and an adjacent one of the sensor electrodes. The dimensions of the grey circles represent the magnitudes of the capacitance data. In the example shown, small capacitance values were measured at the small grey circles 412 and large capacitance values were measured at the large grey circles 414. Four adjacent sensor electrodes (large grey circles 414) exhibited large capacitances. The large capacitance data (self-capacitance or mutual capacitance) measured at the sensor electrodes 414 exceeded a capacitance threshold and the small capacitance data (self-capacitance or mutual capacitance) measured at the sensor electrodes 412 did not exceed a capacitance threshold. The magnitude of the capacitance data exceeding a capacitance threshold can be one of the conditions for the signal processor to detect user input. For example, the capacitance threshold (self-capacitance or mutual capacitance) can be predetermined (e.g., determined at the time of programming the signal processor) or algorithmically determined (e.g., determined and changed from time to time by an algorithm).

Depending on geometrical factors such as the sizes of the sensor electrodes and the distances between the sensor electrodes, a typical human finger might overlap all four sensor electrodes 414 exhibiting large capacitances or a typical finger might contact the cover member at a point in between the sensor electrodes 414. If the map 400 is a map of self-capacitance data, the signal processor is configured to estimate a position of the user input (user-input position) at the cover member in accordance with a map of the self-capacitance data. If the map 400 is a map of mutual capacitance data, the signal processor is configured to estimate a position of the user input (user-input position) at the cover member in accordance with a map of the mutual capacitance data. For example, the signal processor can estimate the user-input position to be point 420, indicated by symbol x, in between the large grey circles 414.

Figure 13:
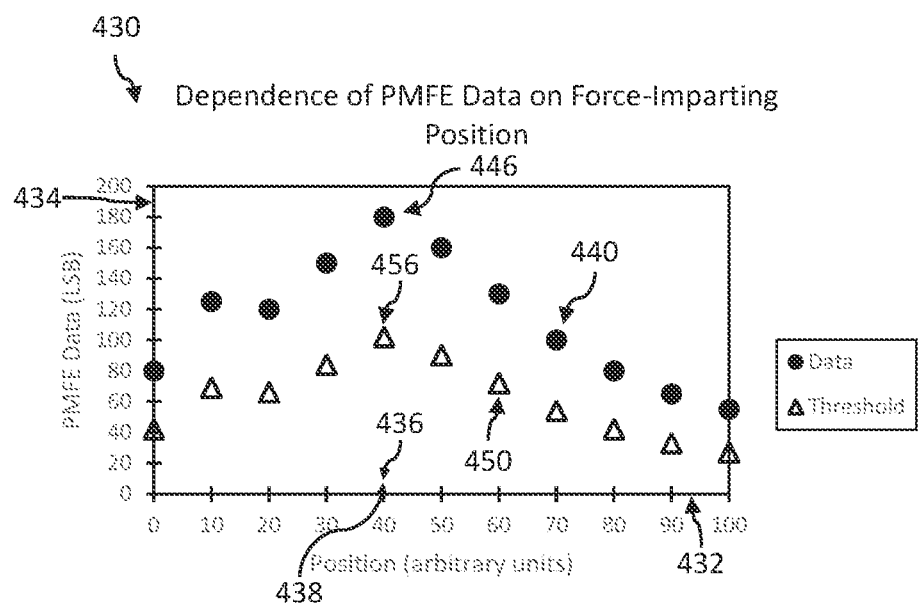
FIG. 13 is a graphical plot showing dependence of measured PMFE data on force-imparting position.

FIG. 13 is a graphical plot 430 showing dependence of PMFE data on force-imparting position. Plot 430 has an X-axis 432 showing force-imparting position (expressed in arbitrary units) and a Y-axis 434 showing PMFE data (expressed in LSB). The force-imparting position varied between 0 and 100 arbitrary units. At each force-imparting position, a standardized force is applied. The standardized force is a force corresponding to a typical press by a finger, such as 7.5 N. The PMFE from which the PMFE voltage signals were output was located at position 438, near 40 arbitrary units. The PMFE data 446 (black circles) are obtained by amplification, analog-to-digital conversion, and other signal processing of the PMFE voltage signals. The PMFE data 440 depend on the force-imparting point. The magnitude and/or the polarity of the PMFE data 440 can depend on a distance between the PMFE and the force-imparting point. The magnitude and/or the polarity of the PMFE data 440 can also depend on local mechanical properties of the cover member and the elastic circuit board substrate. Generally, the PMFE data 440 depend on the position of the force-imparting point, or the user-input position. For example, PMFE data 446, corresponding to force-imparting point 436 (near 40 arbitrary units), has a greater magnitude than any of the other measured PMFE data 440. This force-imparting point 436 is closer than any of the other force-imparting points to the PMFE (at position 438).

Since the PMFE data under a standard imparted force varies depending on the user-input position, it is also possible to set a force threshold 456 (shown as white triangles) that varies in accordance with the user-input position. The magnitude of the PMFE voltage signals exceeding a force threshold can be one of the conditions for the signal processor to detect user input. For example, the force threshold can be predetermined (e.g., determined at the time of programming the signal processor) or algorithmically determined (e.g., determined and changed from time to time by an algorithm). If the self-capacitance is measured, the signal processor can be configured to detect the user input when at least the following conditions are satisfied: (1) a magnitude of the self-capacitance data exceeds a self-capacitance threshold and (2) a magnitude of the PMFE voltage signals exceeds a force threshold that varies in accordance with the user-input position. If the mutual capacitance is measured, the signal processor can be configured to detect the user input when at least the following conditions are satisfied: (1) a magnitude of the mutual capacitance data exceeds a mutual capacitance threshold and (2) a magnitude of the PMFE voltage signals exceeds a force threshold that varies in accordance with the user-input position.

Figure 14:
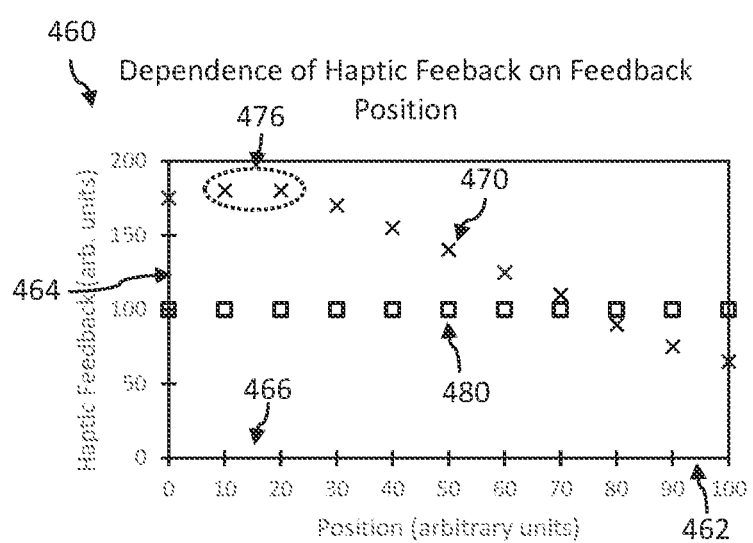
FIG. 14 is a graphic plot showing dependence of haptic feedback on feedback position.

FIG. 14 is a graphic plot 460 showing dependence of haptic feedback on haptic feedback position. Plot 460 has an X-axis 462 showing haptic feedback position (expressed in arbitrary units) and a Y-axis 464 showing a magnitude of haptic feedback (expressed in arbitrary units). The haptic feedback position is the user-input position at which a finger contacts the cover member and senses the haptic feedback. The haptic feedback position varied between 0 and 100 arbitrary units. The haptic motor was located at position 466, near 15 arbitrary units. Two types of haptic feedback data are shown: position-independent haptic feedback 470 (shown as x's) and position-dependent haptic feedback 480 (shown as white squares). In the case of position-independent haptic feedback 470, the haptic driver drives the haptic motor at constant amplitudes. Since the haptic feedback position (user-input position) varies and the distance between the haptic feedback position and the haptic motor position varies, the haptic feedback sensed by the finger varies. The haptic feedback is greatest at data points 476, which are closest to the haptic motor position 466. In the case of position-dependent haptic feedback 480, the haptic driver drives the haptic motor at amplitudes that vary in accordance with the user-input position. In particular, the haptic driver can be configured to drive the haptic motor at varying amplitudes such that the haptic feedback is approximately constant regardless of haptic feedback position (user-input position).

Figure 15:
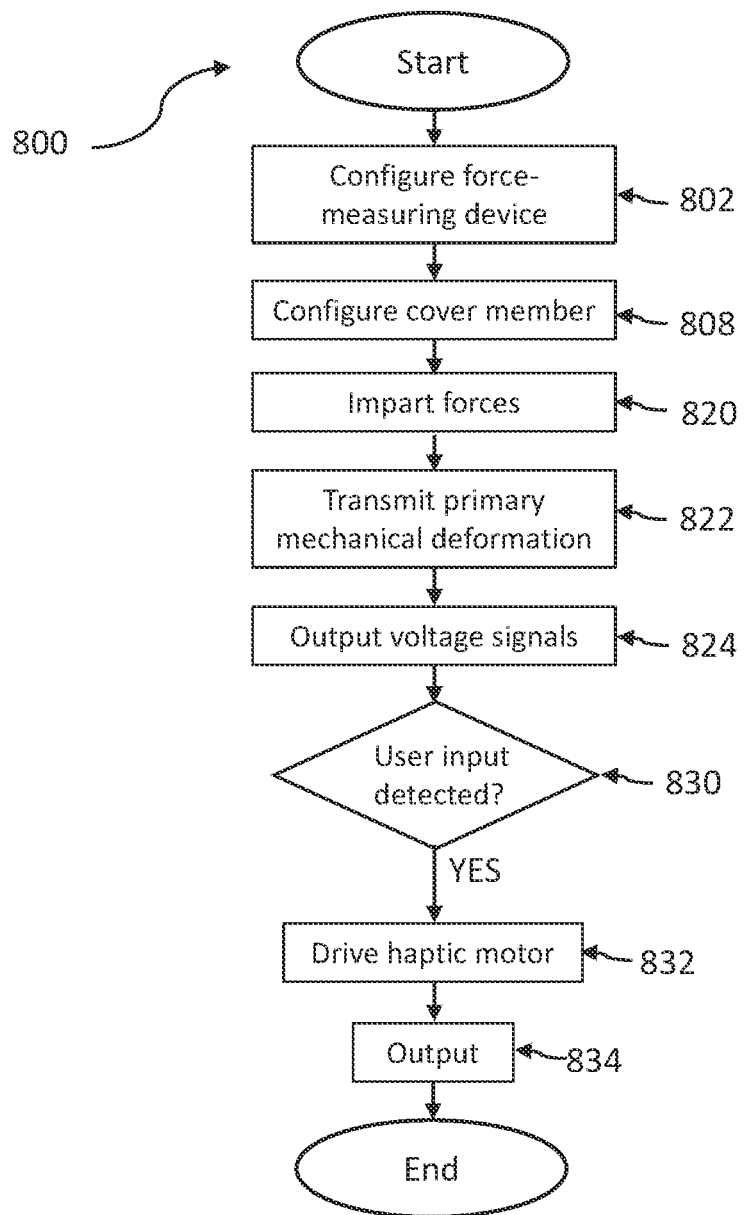
FIGS. 15, 16, and 17 are flow diagrams of methods of detecting a user input at a cover member of a user-input system.

FIG. 15 shows a flow diagram of a method 800 of detecting a user input at a cover member of a user-input system. According to method 800, capacitance sensing is not necessary. The method 800 includes steps 802, 808, 820, 822, 824, 830, 832, and 834. Step 802 includes configuring a force-measuring device 20. The force-measuring device includes a strain-sensing element 42, 44. The force-measuring device 20 is mounted to and electrically connected to an elastic circuit board substrate 102. Step 808 includes configuring the cover member 120 and the elastic circuit board substrate 102 interposed between the force-measuring device 20 and the cover member 120. The elastic circuit board substrate 102 is mechanically coupled to the cover member 120 and to the force-measuring device 20. Step 820 includes imparting forces at the cover member 120 such that the cover member 120 undergoes a primary mechanical deformation. For example, this can include a finger 118 touching and pressing the cover member at a force-imparting point 119. Step 822 includes transmitting, by the elastic circuit board substrate 102, a portion of the primary mechanical deformation to the force-measuring device 20 such that the force-measuring device undergoes a secondary mechanical deformation. Step 824 includes outputting, by the strain-sensing element, voltage signals in accordance with a time-varying strain at the strain-sensing element resulting from the secondary mechanical deformation.

Step 830 is a decision step. Step 830 includes detecting, by a signal processor electronically coupled to the strain-sensing element, a user input in accordance with the voltage signals. Steps 832 and 834 can be carried out if a user input is detected (YES at step 830). Step 832 includes driving, by a haptic driver 354, a haptic motor 206 mechanically coupled to the cover member 120 when the signal processor detects the user input. Step 834 is an optional step that can be carried out if a user input is detected (YES at step 830). Step 834 includes outputting a signal by the signal processor. For example, the signal can be sent to a microprocessor.

Figure 16:
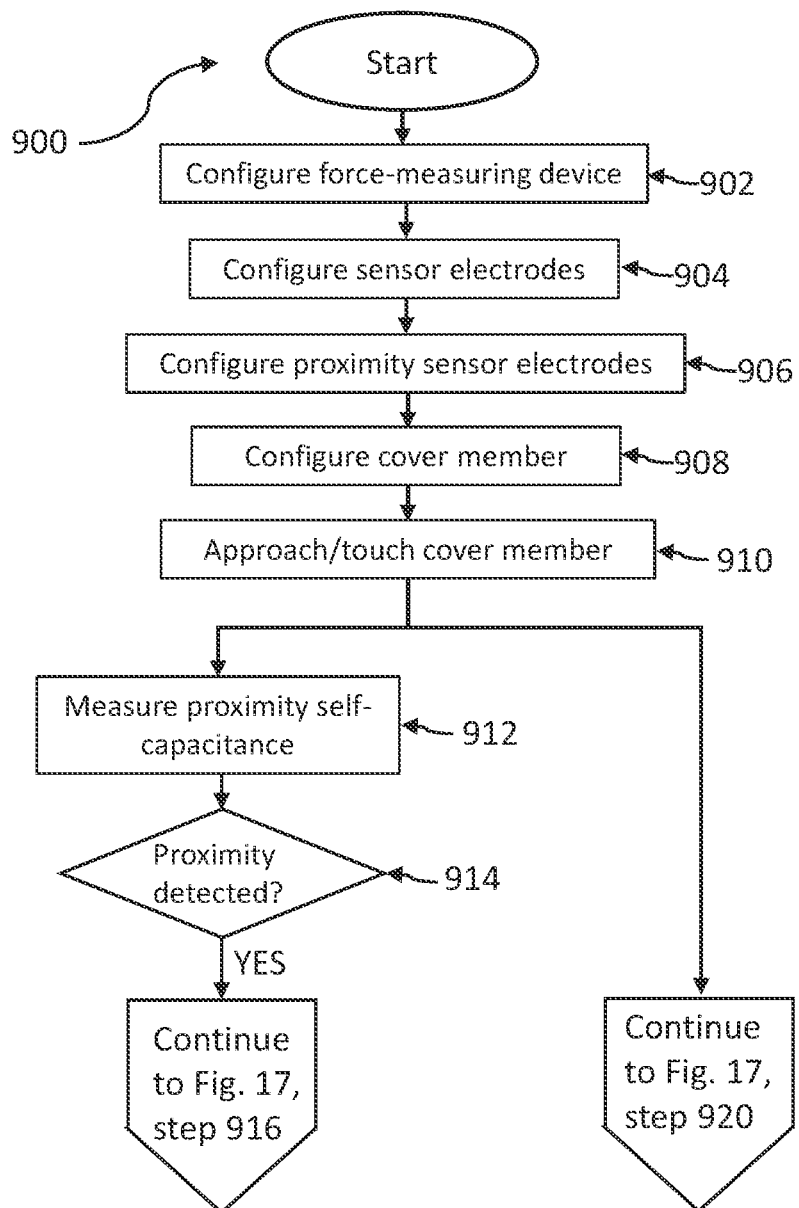
Figure 17:
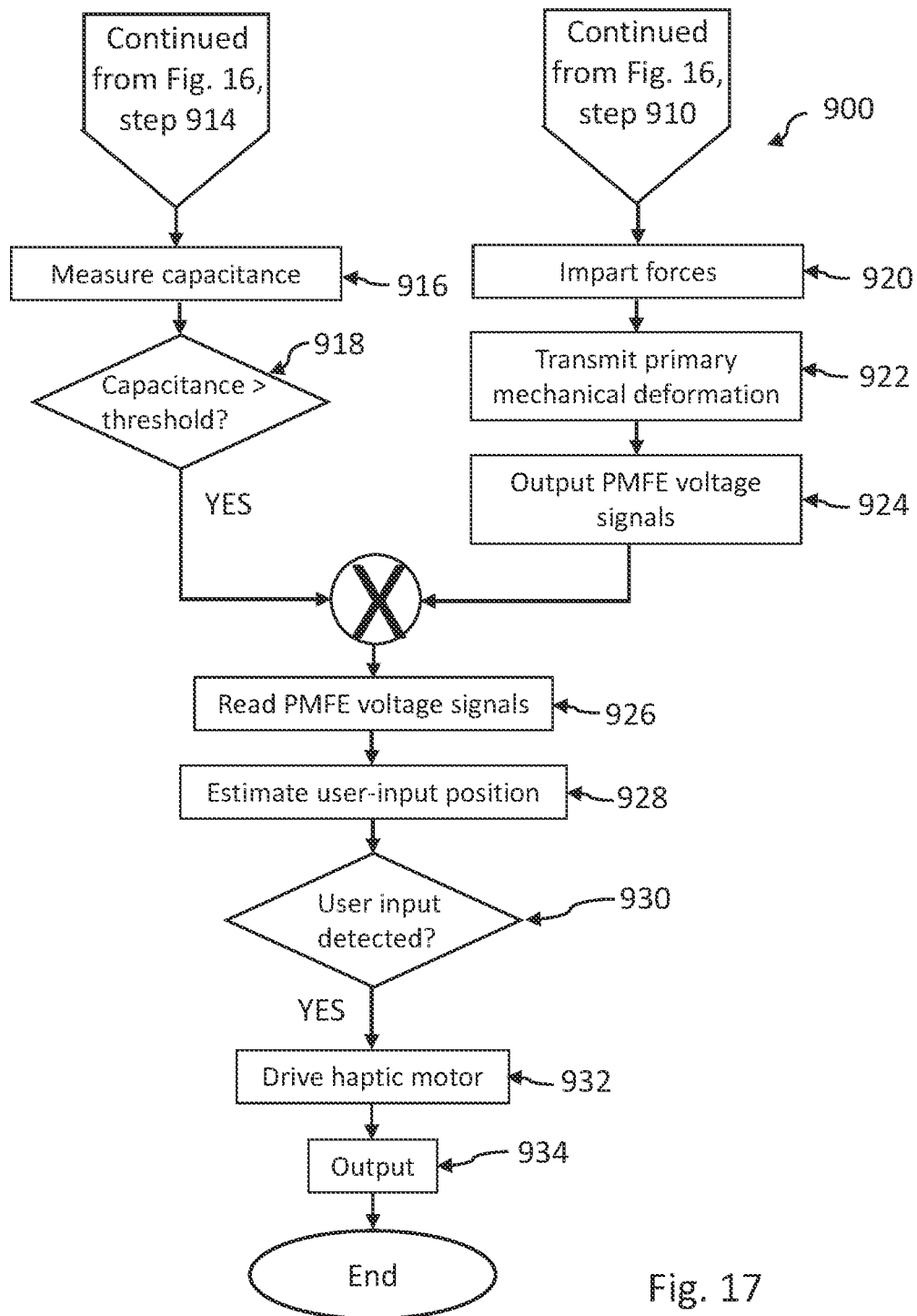

FIGS. 16 and 17 show a flow diagram of a method 900 of detecting a user input at an electrically non-conducting cover member of a user-input system. According to method 900, capacitance sensing is used. Preferably, both proximity sensor electrodes and sensor electrodes are used. First, proximity self-capacitance is measured using the proximity sensor electrode. If proximity is detected, then self-capacitance and/or mutual capacitance are measured using the sensor electrodes. If the measured capacitance (self-capacitance and/or mutual capacitance) exceeds a capacitance (self-capacitance and/or mutual capacitance) threshold, then PMFE voltage signals are read.

The method 900 includes steps 902, 904, 906, 908, 910, 912, 914, 916, 918, 920, 922, 924, 926, 928, 930, 932, and 934. Step 902 includes configuring a force-measuring device 20. The force-measuring device 20 includes a piezoelectric micromechanical force-measuring element (PMFE) (342, 344, 346, 348). The force-measuring device 20 is mounted to and electrically connected to an elastic circuit board substrate 102. The PMFE is electronically coupled to a signal processor 46. Step 904 includes configuring sensor electrodes (112, 114, 116) on or in the elastic circuit board substrate 102. The sensor electrodes are electronically coupled to the signal processor 46. Step 906 includes configuring a proximity sensor electrode (230) on or in the elastic circuit board substrate 102. The proximity sensor electrode is electronically coupled to the signal processor 46. The proximity sensor electrode encloses an area that is greater than an area of one of the sensor electrodes by a factor of at least 2. Step 908 includes configuring the cover member 120 and the elastic circuit board substrate 102 interposed between the force-measuring device 20 and the cover member 120. The elastic circuit board substrate 102 is mechanically coupled to the cover member 120 and to the force-measuring device 20.

Step 910 includes approaching and/or touching the cover member (by an object, e.g., a finger). Step 912 is carried out after step 910. Step 912 includes measuring, by the signal processor, a capacitance between the proximity sensor electrode 230 and its surrounding environment (proximity self-capacitance data). Additionally, step 920 can occur after step 910. Step 920 includes imparting forces at the cover member 120 such that the cover member 120 undergoes a primary mechanical deformation. For example, after a finger 118 approaches and touches the cover member (step 910), the finger can press against (impart a force to) the cover member (step 920) at a force-imparting point. Step 922 includes transmitting, by the elastic circuit board substrate 102, a portion of the primary mechanical deformation to the force-measuring device 20 such that the force-measuring device undergoes a secondary mechanical deformation. Step 924 includes outputting, by the strain-sensing element, voltage signals in accordance with a time-varying strain at the strain-sensing element resulting from the secondary mechanical deformation.

Step 914 is a decision step after step 912. Step 914 includes detecting, by the signal processor, proximity of an object to the cover member when at least the following condition is satisfied: a magnitude of the proximity self-capacitance data exceeds a proximity self-capacitance threshold. Step 916 is carried out when proximity of the object is detected by the signal processor at step 914. Step 916 includes, measuring, by the signal processor, for each of the sensor electrodes, (1) a capacitance between the respective sensor electrode and its surrounding environment (self-capacitance data) and/or (2) a capacitance between the respective sensor electrode and an adjacent one of the sensor electrodes (mutual capacitance data).

Step 926 is carried out when one or more of the following conditions are satisfied: (1) a magnitude of the self-capacitance data exceeds a self-capacitance threshold and (2) a magnitude of the mutual capacitance data exceeds a mutual capacitance threshold (YES at decision step 918). Step 926 includes reading, by the signal processor, at least some of the PMFE voltage signals. Step 926 is feasible if the PMFE is outputting PMFE voltage signals (step 924) resulting from a secondary mechanical deformation (step 922). In the self-capacitance mode, step 928 includes estimating, by the signal processor, a position of the user input (user-input position) at the cover member in accordance with a map of the self-capacitance data. In the mutual capacitance mode, step 928 includes estimating, by the signal processor, a position of the user input (user-input position) at the cover member in accordance with a map of the mutual capacitance data.

Step 930 is a decision step. Step 930 includes detecting, by the signal processor, a user input at the cover member in accordance with the PMFE voltage signals and at least one of the self-capacitance data and the mutual capacitance data. In the self-capacitance mode, step 930 can include detecting the user input when at least the following conditions are satisfied: (1) a magnitude of the self-capacitance data exceeds a self-capacitance threshold and (2) a magnitude of the PMFE voltage signals exceeds a force threshold that varies in accordance with the user-input position. In the mutual capacitance mode, step 930 can include detecting the user input when at least the following conditions are satisfied: (1) a magnitude of the mutual capacitance data exceeds a mutual capacitance threshold and (2) a magnitude of the PMFE voltage signals exceeds a force threshold that varies in accordance with the user-input position.

Steps 932 and 934 can be carried out if user input is detected (YES at step 930). Step 932 includes driving, by a haptic driver 354, a haptic motor 206 mechanically coupled to the cover member 120 when the signal processor detects the user input. Step 932 can include driving, by the haptic driver, the haptic motor at amplitudes that vary in accordance with user-input position. Step 934 is an optional step that can be carried out if a user input is detected (YES at step 930). Step 934 includes outputting a signal by the signal processor. For example, the signal can be sent to a microprocessor.

What is claimed is:

1. A user-input system, comprising:
 a force-measuring device comprising a semiconductor die, the semiconductor die comprising a micro-electromechanical systems (MEMS) portion, the MEMS portion comprising a piezoelectric micromechanical force-measuring element (PMFE);
a cover member; and
an elastic circuit board substrate interposed between the force-measuring device and the cover member and mechanically coupled to the cover member and to the force-measuring device, the force-measuring device being mounted to and electrically connected to the elastic circuit board substrate;
wherein the cover member undergoes a primary mechanical deformation in response to forces imparted at the cover member;
the elastic circuit board substrate transmits a portion of the primary mechanical deformation to the force-measuring device resulting in a concurrent secondary mechanical deformation of the force-measuring device; and
the PMFE is configured to output voltage signals in accordance with a time-varying strain at the PMFE resulting from the secondary mechanical deformation.

2. A user-input system, comprising:
a force-measuring device comprising a semiconductor die, the semiconductor die comprising a micro-electromechanical systems (MEMS) portion, the MEMS portion comprising a piezoelectric micromechanical force-measuring element (PMFE);
an electrically non-conducting cover member;
an elastic circuit board substrate interposed between the force-measuring device and the cover member and mechanically coupled to the cover member and to the force-measuring device, the force-measuring device being mounted to and electrically connected to the elastic circuit board substrate;
sensor electrodes positioned on or in the elastic circuit board substrate; and
a signal processor electronically coupled to the PMFE and the sensor electrodes;
wherein the cover member undergoes a primary mechanical deformation in response to forces imparted at the cover member;
the elastic circuit board substrate transmits a portion of the primary mechanical deformation to the force-measuring device resulting in a concurrent secondary mechanical deformation of the force-measuring device; and
the PMFE is configured to output voltage signals in accordance with a time-varying strain at the PMFE resulting from the secondary mechanical deformation;
the signal processor is configured to read at least some of the PMFE voltage signals;
the signal processor is configured to, for each of the sensor electrodes, (1) measure a capacitance between the respective sensor electrode and its surrounding environment as self-capacitance data and/or (2) measure a capacitance between the respective sensor electrode and an adjacent one of the sensor electrodes as mutual capacitance data; and
the signal processor is configured to detect a user input at the cover member in accordance with the PMFE voltage signals and at least one of the self-capacitance data and the mutual capacitance data.

3. The user-input system of claim 2, wherein at least a portion of the signal processor is included in the force-measuring device.

4. The user-input system of claim 3, wherein an entirety of the signal processor is included in the force-measuring device.

5. The user-input system of claim 2, wherein:
the signal processor is configured to estimate a position of the user input at the cover member in accordance with a map of the self-capacitance data; and
the signal processor is configured to detect the user input when at least the following conditions are satisfied: (1) a magnitude of the self-capacitance data exceeds a self-capacitance threshold and (2) a magnitude of the PMFE voltage signals exceeds a force threshold that varies in accordance with the user-input position.

6. The user-input system of claim 2, wherein:
the signal processor is configured to estimate a position of the user input at the cover member in accordance with a map of the mutual capacitance data; and
the signal processor is configured to detect the user input when at least the following conditions are satisfied: (1) a magnitude of the mutual capacitance data exceeds a mutual capacitance threshold and (2) a magnitude of the PMFE voltage signals exceeds a force threshold that varies in accordance with the user-input position.

7. The user-input system of claim 2, wherein:
the user-input system additionally comprises a haptic driver and a haptic motor driven by the haptic driver, the haptic motor being mechanically coupled to the cover member; and
the haptic driver is configured to drive the haptic motor when the signal processor detects the user input.

8. The user-input system of claim 7, wherein at least a portion of the haptic driver is included in the force-measuring device.

9. The user-input system of claim 8, wherein an entirety of the haptic driver is included in the force-measuring device.

10. The user-input system of claim 7, wherein:
the signal processor is configured to estimate a position of the user input at the cover member; and
the haptic driver is configured to drive the haptic motor at amplitudes that vary in accordance with the user-input position.

11. The user-input system of claim 2, wherein:
the user-input system additional comprises a proximity sensor electrode positioned on or in the elastic circuit board substrate, the proximity sensor electrode being electronically coupled to the signal processor, the proximity sensor electrode enclosing an area that is greater than an area of one of the sensor electrodes by a factor of at least 2;
the signal processor is configured to measure a capacitance between the proximity sensor electrode and its surrounding environment as proximity self-capacitance data; and
the signal processor is configured to detect proximity of an object to the cover member when at least the following condition is satisfied: a magnitude of the proximity self-capacitance data exceeds a proximity self-capacitance threshold.

12. The user-input system of claim 11, wherein the proximity sensor electrode encloses at least one of the sensor electrodes.

13. The user-input system of claim 11, wherein the signal processor is configured to measure the self-capacitance data and/or the mutual capacitance data when the signal processor detects proximity of the object.

14. The user-input system of claim 2, wherein the signal processor is configured to read at least some of the PMFE voltage signals when one or more of the following conditions are satisfied: (1) a magnitude of the self-capacitance data exceeds a self-capacitance threshold and (2) a magnitude of the mutual capacitance data exceeds a mutual capacitance threshold.

15. A method of detecting a user input at a cover member of a user-input system, comprising the steps of:
  (A1) configuring a force-measuring device comprising a semiconductor die, the semiconductor die comprising a micro-electro-mechanical systems (MEMS) portion, the MEMS portion comprising a piezoelectric micromechanical force-measuring element (PMFE), the force-measuring device being mounted to and electrically connected to an elastic circuit board substrate;
  (A2) configuring the cover member and the elastic circuit board substrate interposed between the force-measuring device and the cover member, the elastic circuit board substrate being mechanically coupled to the cover member and to the force-measuring device;
  (A3) transmitting, by the elastic circuit board substrate, a portion of a primary mechanical deformation of the cover member to the force-measuring device such that the force-measuring device undergoes a secondary mechanical deformation; and
  (A4) outputting, by the PMFE, voltage signals in accordance with a time-varying strain at the PMFE resulting from the secondary mechanical deformation.

16. The method of claim 15, additionally comprising:
  (A5) detecting, by a signal processor electronically coupled to the strain-sensing element, a user input in accordance with the voltage signals.

17. A method of detecting a user input at an electrically non-conducting cover member of a user-input system, comprising the steps of:
  (B1) configuring a force-measuring device comprising a semiconductor die, the semiconductor die comprising a micro-electro-mechanical systems (MEMS) portion, the MEMS portion comprising a piezoelectric micromechanical force-measuring element (PMFE), the force-measuring device being mounted to and electrically connected to an elastic circuit board substrate, and the PMFE being electronically coupled to a signal processor;
  (B2) configuring sensor electrodes on or in the elastic circuit board substrate, the sensor electrodes being electronically coupled to the signal processor;
  (B3) configuring the cover member and the elastic circuit board substrate interposed between the force-measuring device and the cover member, the elastic circuit board substrate being mechanically coupled to the cover member and to the force-measuring device;
  (B4) transmitting, by the elastic circuit board substrate, a portion of a primary mechanical deformation of the cover member to the force-measuring device such that the force-measuring device undergoes a secondary mechanical deformation; and
  (B5) outputting, by the PMFE, voltage signals in accordance with a time-varying strain at the PMFE resulting from the secondary mechanical deformation;
  (B6) measuring, by the signal processor, for each of the sensor electrodes, (1) a capacitance between the respective sensor electrode and its surrounding environment as self-capacitance data and/or (2) a capacitance between the respective sensor electrode and an adjacent one of the sensor electrodes as mutual capacitance data;
  (B7) reading, by the signal processor, at least some of the PMFE voltage signals; and
  (B8) detecting, by the signal processor, a user input at the cover member in accordance with the PMFE voltage signals and at least one of the self-capacitance data and the mutual capacitance data.

18. The method of claim 17, wherein:
the step (B8) comprises, estimating, by the signal processor, a position of the user input at the cover member in accordance with a map of the self-capacitance data; and
the step (B8) comprises detecting the user input when at least the following conditions are satisfied: (1) a magnitude of the self-capacitance data exceeds a self-capacitance threshold and (2) a magnitude of the PMFE voltage signals exceeds a force threshold that varies in accordance with the user-input position.

19. The method of claim 17, wherein:
the step (B8) comprises, estimating, by the signal processor, a position of the user input at the cover member in accordance with a map of the mutual capacitance data; and
the step (B8) comprises detecting the user input when at least the following conditions are satisfied: (1) a magnitude of the mutual capacitance data exceeds a mutual capacitance threshold and (2) a magnitude of the PMFE voltage signals exceeds a force threshold that varies in accordance with the user-input position.

20. The method of claim 17, additionally comprising the step of:
  (B9) driving, by a haptic driver, a haptic motor mechanically coupled to the cover member when the signal processor detects the user input.

21. The method of claim 20, wherein:
the step (B8) comprises, estimating, by the signal processor, a position of the user input at the cover member; and
the step (B9) comprises, driving, by the haptic driver, the haptic motor at amplitudes that vary in accordance with user-input position.

22. The method of claim 17, additionally comprising the steps of:
  (B10) configuring a proximity sensor electrode on or in the elastic circuit board substrate, the proximity sensor electrode being electronically coupled to the signal processor, the proximity sensor electrode enclosing an area that is greater than an area of one of the sensor electrodes by a factor of at least 2;
  (B11) measuring, by the signal processor, a capacitance between the proximity sensor electrode and its surrounding environment as proximity self-capacitance data; and
  (B12) detecting, by the signal processor, proximity of an object to the cover member when at least the following condition is satisfied: a magnitude of the proximity self-capacitance data exceeds a proximity self-capacitance threshold.

23. The method of claim 22, wherein:
step (B6) is carried out when proximity of the object is detected by the signal processor at step (B12).

24. The method of claim 17, wherein:
step (B7) is carried out when one or more of the following conditions are satisfied:
(1) a magnitude of the self-capacitance data exceeds a self-capacitance threshold and (2) a magnitude of the mutual capacitance data exceeds a mutual capacitance threshold.

* * * * *